United States Patent
Torii et al.

(10) Patent No.: US 9,218,816 B2
(45) Date of Patent: Dec. 22, 2015

(54) DAC DEVICE AND AUDIO SYSTEM

(71) Applicant: PANASONIC CORPORATION, Osaka (JP)

(72) Inventors: Toshihiro Torii, Aichi (JP); Yoshihiro Horii, Osaka (JP); Masashi Uchida, Osaka (JP); Junji Nakatsuka, Osaka (JP); Takaaki Sato, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 16 days.

(21) Appl. No.: 14/209,196

(22) Filed: Mar. 13, 2014

(65) Prior Publication Data

US 2014/0195225 A1 Jul. 10, 2014

Related U.S. Application Data

(63) Continuation of application No. PCT/JP2012/005295, filed on Aug. 23, 2012.

(30) Foreign Application Priority Data

Sep. 20, 2011 (JP) ................................ 2011-204652

(51) Int. Cl.
*H03M 1/66* (2006.01)
*G10L 19/00* (2013.01)
(Continued)

(52) U.S. Cl.
CPC ................. *G10L 19/00* (2013.01); *H03M 1/66* (2013.01); *H03M 3/388* (2013.01); *H03L 7/0891* (2013.01);
(Continued)

(58) Field of Classification Search
CPC ......... H03M 1/747; H03M 1/00; H03M 1/12; H03M 1/785; H03L 7/0891
USPC ........... 341/144, 118, 120, 146, 154; 327/156
See application file for complete search history.

(56) References Cited

U.S. PATENT DOCUMENTS

| 4,758,781 A | 7/1988 | Ueno et al. |
| 5,539,403 A | 7/1996 | Tani et al. |
| 2010/0315275 A1 | 12/2010 | Murahashi |

FOREIGN PATENT DOCUMENTS

| JP | 61-005625 A | 1/1986 |
| JP | 61-070437 U | 5/1986 |

(Continued)

OTHER PUBLICATIONS

Tani, Y.: "Digital-to-Analong converting technique utilizing 1-bit D-to-A converter array", Institute of Electronics, Information and Communication Engineers, vol. 94, No. 116, CAS94-9, Jun. 1994, pp. 63-70, with English abstract.

(Continued)

*Primary Examiner* — Joseph Lauture
(74) *Attorney, Agent, or Firm* — McDermott Will & Emery LLP

(57) ABSTRACT

In a DAC device, a distortion correction function g1(x) of a harmonic obtained from a result of a frequency analysis on an analog output signal of a DAC circuit is obtained. A correction value is determined based on the correction function g1(x) in accordance with an input digital signal, and is previously stored in a memory. A nonlinear correction circuit reads a corresponding correction value from the memory in accordance with the value of a digital signal output from a digital filter, and transmits the correction value to a subtractor. The subtractor subtracts the correction value from the digital signal output from the digital filter.

16 Claims, 9 Drawing Sheets

(51) Int. Cl.
 H03M 1/12 (2006.01)
 H03M 1/00 (2006.01)
 H03M 1/78 (2006.01)
 H03M 1/74 (2006.01)
 H03L 7/089 (2006.01)
 H03M 3/00 (2006.01)

(52) U.S. Cl.
 CPC . *H03M 1/00* (2013.01); *H03M 1/12* (2013.01); *H03M 1/747* (2013.01); *H03M 1/785* (2013.01); *H03M 3/50* (2013.01)

(56) References Cited

FOREIGN PATENT DOCUMENTS

| | | |
|---|---|---|
| JP | 62-145926 A | 6/1987 |
| JP | 63-224525 A | 9/1988 |
| JP | 10-049307 A | 2/1998 |
| JP | 2822776 B2 | 11/1998 |
| WO | 2008-081887 A1 | 7/2008 |

OTHER PUBLICATIONS

International Search Report issued in PCT/JP2012/005295, dated Oct. 9, 2012, with English translation.

DAC DEVICE AND AUDIO SYSTEM

CROSS-REFERENCE TO RELATED APPLICATIONS

This is a continuation of International Application No. PCT/JP2012/005295 filed on Aug. 23, 2012, which claims priority to Japanese Patent Application No. 2011-204652 filed on Sep. 20, 2011. The entire disclosures of these applications are incorporated by reference herein.

BACKGROUND

The present disclosure relates to digital to analog converter (DAC) devices that convert digital signals to analog signals.

As described in Japanese Patent No. 2822776 and the Institute of Electronics, Information and Communication, Engineers Technical Report Vol. 94, No. 116, pp. 63-70 (CAS94-9), June, 1994, for example, Applicant proposes a DAC device that is a type of an oversampling DAC device performing DA conversion with a noise shaper higher than a sampling frequency of a digital input signal, and uses a noise shaper and a 1-bit DAC row composed of a plurality of 1-bit DACs so that the DAC device does not need a high-clock frequency and a high output variation accuracy among the 1-bit DACs.

All types of DAC devices including oversampling DAC devices as described above are desired to reduce distortion components included in analog output signals of the DAC devices.

In view of this, International Patent Publication No. WO 2008/081887, for example, proposes a technique for suppressing an odd-order harmonic distortion of a signal that drives a D-Class amplifier (a switching amplifier) in an oversampling DAC device using the D-Class amplifier.

SUMMARY

The DAC device of International Patent Publication No. WO 2008/081887, however, is the DAC device using the D-Class amplifier, and generates only odd-order harmonics (third-order, fifth-order, . . . harmonics) that are odd multiples of a frequency of an input signal because of the configuration thereof. Thus, disadvantageously, this DAC device corrects only odd-order harmonic distortion and is limited to DAC devices using D-Class amplifiers.

The present disclosure is directed to various types of DAC devices that are not limited to DAC devices using D-Class amplifiers. An object of the present disclosure is to achieve low distortion by effectively reducing all the integer-order harmonics including odd-order (third-order, fifth order, . . . ) harmonics and even-order (second-order, fourth-order, . . . ) harmonics.

To achieve the object, the present disclosure is directed to the fact that distortion of an analog output signal of a DAC device is caused by analog elements in DA converters, e.g., parasitic resistances of wires connected to a predetermined power supply and a GND power supply and switching characteristics of internal switches. In view of this, in the present disclosure, harmonic components occurring due to these analog elements in the DA converters are reduced in order to reduce distortion components included in an analog output signal of the DAC device. Then, a digital correction value concerning odd-order and even-order high-frequency distortions caused by the analog elements in the DA converters is previously subtracted from an input digital signal. The resulting signal is subjected to digital correction for opposite distortion. In this manner, distortions can be reduced.

In an aspect of the present disclosure, a DAC device includes: a subtraction section configured to subtract a correction value from an input digital signal; a DAC circuit configured to receive the digital signal from which the correction value has been subtracted by the subtraction section, and to convert the digital signal to an analog signal; and a correction value output section, wherein when the input digital signal is output to the DAC circuit without passing through the subtraction section, the correction value output section outputs a distortion component included in an analog signal output from the DAC circuit in accordance with the input digital signal, as a correction value to the subtraction section by using a distortion correction function in accordance with the input digital signal obtained based on information on an analog element in the DAC circuit.

In another aspect of the present, in the DAC device, the analog element in the DAC circuit is at least one selected from the group consisting of a resistance of wiring connecting the DAC circuit to a predetermined power supply, a resistance of wiring connecting the DAC circuit to a GND power supply, a resistance of an internal switch, and an output resistance.

In yet another aspect of the present disclosure, in the DAC device, the correction value output section includes: a memory section configured to store a correlation between each of input sections obtained by dividing an entire input section corresponding to an input voltage range of the input digital signal of the DAC device in the distortion correction function, and a correction value based on the distortion correction function that is previously determined for the corresponding one of the input sections; and a nonlinear correction circuit configured to receive the input digital signal, read a correction value corresponding to the received digital signal from the memory section, and output the correction value to the subtraction section.

In still another aspect of the present disclosure, in the DAC device, the memory section stores a plurality of distortion correction functions in accordance with a voltage range of a digital signal to be input.

In still another aspect of the present disclosure, in the DAC device, the correction value output section is a computing section that receives the input digital signal, and based on the received digital signal and the distortion correction function, obtains a correction value to be output to the subtraction section.

In the foregoing aspects, although harmonics arise due to nonlinear characteristics of internal analog elements in the DAC circuit, distortion caused by high-order harmonics due to nonlinear characteristics of the DAC circuit can be effectively reduced. Specifically, a distortion component included in an analog signal output from the DAC circuit is obtained in accordance with an input digital signal by, for example, using a distortion correction function obtained based on information on a harmonic component that is a result of a frequency analysis of an analog output signal of the DA converter or a distortion correction function obtained based on analog elements such as a resistance of an internal switch of the DAC circuit. The distortion component is used as a correction value, and the correction value is subtracted from the input digital signal. The resulting signal is then subjected to a digital correction for opposite distortion.

As described above, a DAC device according to the present disclosure can reduce the influence of harmonic components occurring due to analog elements, e.g., parasitic resistances of a predetermined power supply and a GND power supply and switching characteristics of an internal switch, in a DAC circuit that increases distortion. As a result, advantageously, low distortion can be achieved.

DETAILED DESCRIPTION

Embodiments of DAC devices of the present disclosure will be described hereinafter with reference to the drawings

First Embodiment

Figure 1:
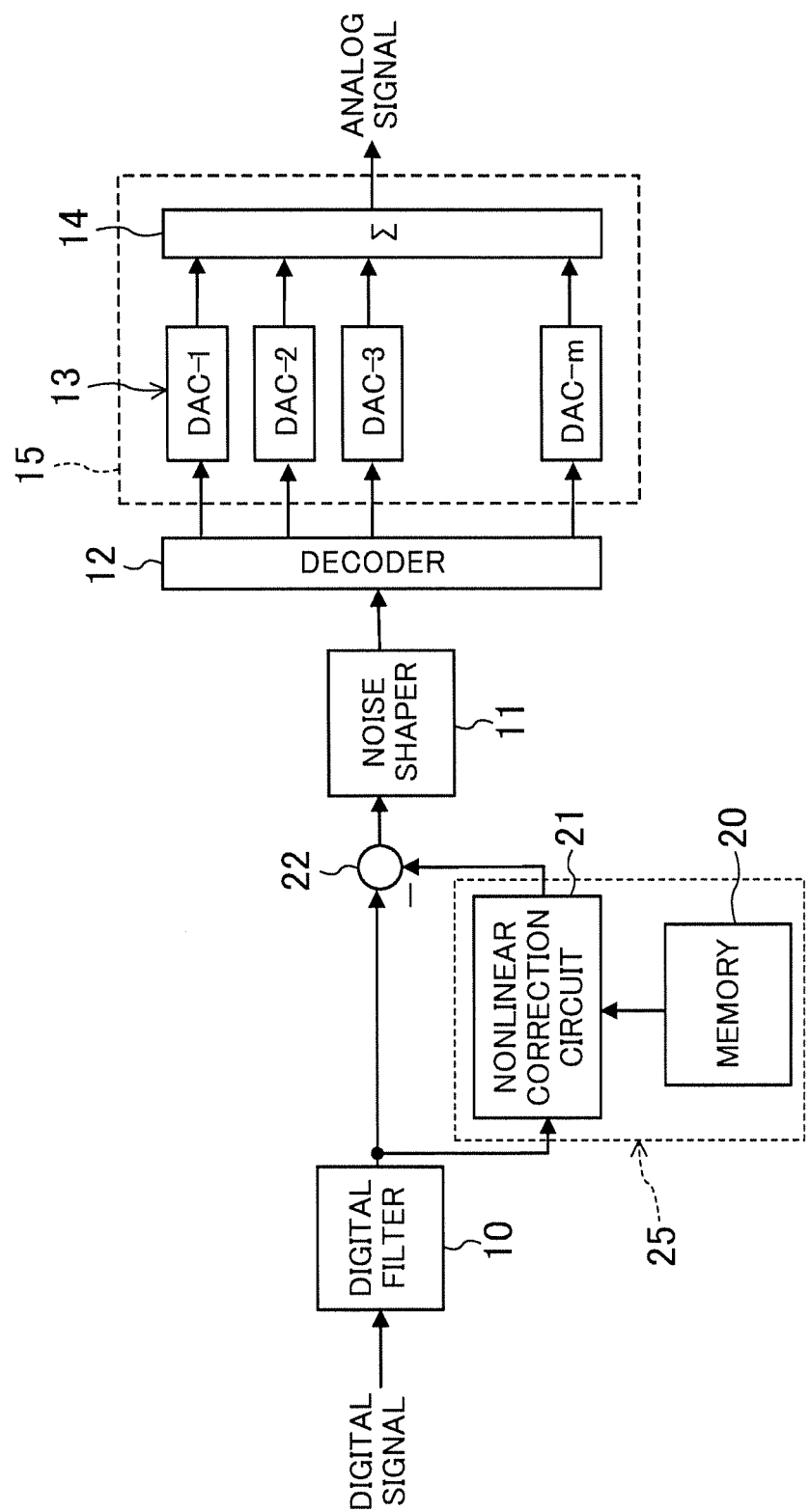
FIG. 1 is a block diagram illustrating an overall configuration of a DAC device according to a first embodiment of the present disclosure.

FIG. 1 is a block diagram illustrating an oversampling DAC device as an example DAC device according to a first embodiment of the present disclosure.

In FIG. 1, reference character 10 denotes a digital filter that multiplies a sampling frequency of an input digital signal by n (where n≥2). Reference character 11 denotes a noise shaper that receives an output from the digital filter 10, and changes frequency characteristics of noise to predetermined characteristics together with word length limitation. Reference character 12 denotes a decoder that receives an output from the noise shaper 11 and converts the received digital signal into a 1-bit signal series corresponding to the value of the received digital signal. Reference character 13 denotes a 1-bit DAC row that includes a plurality of 1-bit DACs and converts the 1-bit signal series from the decoder 12 into an analog signal. Reference character 14 denotes an analog adder that obtains a sum of outputs from the 1-bit DACs of the 1-bit DAC row 13.

Reference character 15 denotes a DAC circuit that includes the 1-bit DAC row 13 and the analog adder 14. The 1-bit DAC row 13 includes first to m-th DACs DAC-1 to DAC-m, where m denotes the number of DACs and is a natural number of two or more. The analog adder 14 obtains the sum of the m analog signals from the 1-bit DAC row 13, and outputs the sum as an analog signal.

In the DAC device of FIG. 1 with the foregoing configuration, the digital filter 10 and the noise shaper 11 change a digital input signal with a sampling frequency fs (44.1 kHz in the case of an audio signal of a CD) to, for example, a 64-fold oversampling frequency 64·fs, 11 (=p) level, the decoder 12 decodes the signal to m 1-bit signals, and then the DAC circuit 15 converts the m 1-bit signals to an analog signal. That is, the DAC device serves as a so-called oversampling DAC device that converts a digital signal to an analog signal with a higher sampling frequency.

In the oversampling DAC device of FIG. 1, in outputting an m-digit 1-bit signal series from m 1-bit converters DAC-1 to DAC-m of the 1-bit DAC row 13, the output of the decoder 12 is previously determined such that each digit is shifted to a higher-order side by one digit, for example, at every output of one sample data, the excess highest-order digit is caused to appear as the lowest-order digit, and this process is repeatedly performed in cycles. In this manner, a correlation between an output value of the noise shaper 11 and a specific 1-bit converter DAC disappears, and occurrence of distortion and noise in a signal frequency band is reduced even with a variation in output among the 1-bit converters DAC-1 to DAC-m.

In FIG. 1, reference character 20 denotes a memory (a memory section) that stores a look-up table. Reference character 21 denotes a nonlinear correction circuit that determines a correction value based on the look-up table in accordance with an output of the digital filter 10. Reference character 22 is a subtractor (a subtraction section) that subtracts the correction value output from the nonlinear correction circuit 21 from a digital signal processed by the digital filter 10 and outputs the resulting signal to the noise shaper 11.

In the 1-bit DAC row 13, each of the 1-bit DACs DAC-1 to DAC-m has nonlinear characteristics depending on a resistance of wiring connecting the 1-bit DAC to a predetermined power supply, a resistance of wiring connecting the 1-bit DAC to a GND power supply, and a resistance of an internal switching device itself. The nonlinear characteristics vary among the 1-bit DACs. Thus, distortions affected by the nonlinear characteristics of the 1-bit DACs are added to an analog signal that has been output from the DAC circuit 15 and subjected to ideal DA conversion from a digital signal input to the digital filter 10. This embodiment employs a configuration for reducing the distortions by using the memory 20, the nonlinear correction circuit 21, and the subtractor 22.

Reduction of distortions by using the memory 20, the nonlinear correction circuit 21, and the subtractor 22 will now be described.

Figure 2:
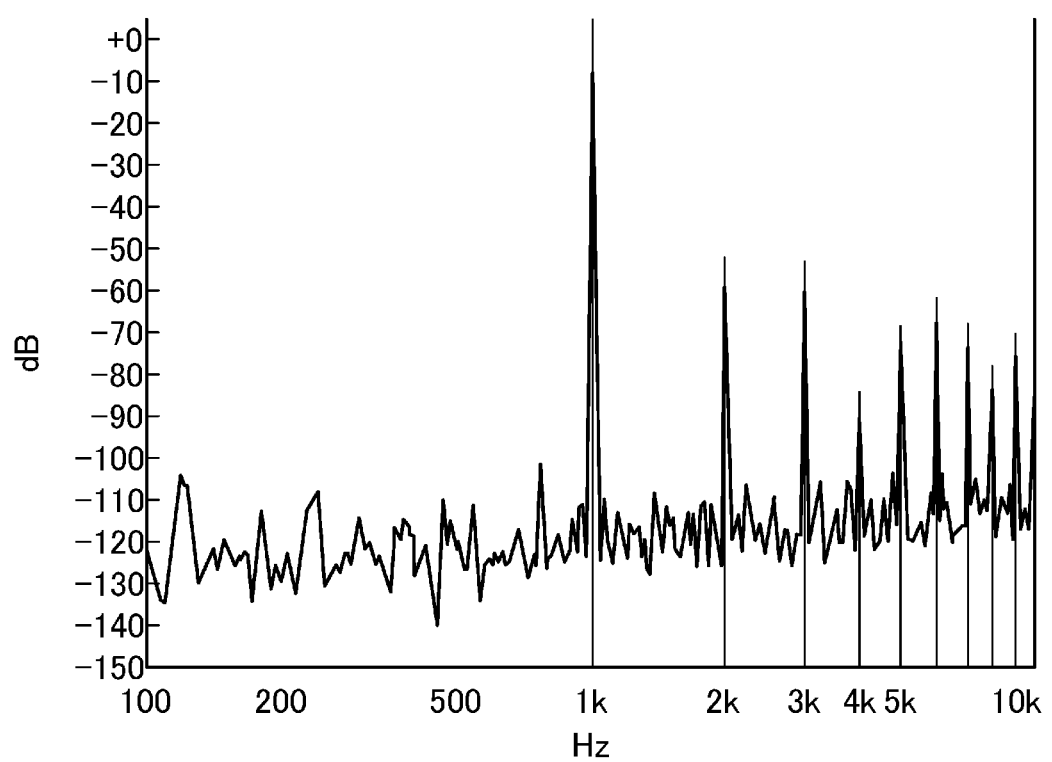
FIG. 2 is a graph showing an example of a result of a frequency analysis on an analog output signal of the DAC device before distortion correction.

FIG. 2 shows an example of a result of a frequency analysis on an analog output signal from the DAC circuit 15 in a case where the DAC device of FIG. 1 does not include the memory 20, the nonlinear correction circuit 21, and the subtractor 22. As shown in this result, low-frequency distortion components such as second-order and third-order frequencies are dominant in general. It will now be described how correction functions for a second-order distortion and a third-order distortion are derived from information on the second-order distortion and the third-order distortion obtained from a result of a frequency analysis on the analog output signal.

First, calculation of a correction coefficient for the second-order distortion will be described.

The input signal x to the digital filter 10 can be expressed as a sine wave obtained by Equation 1:

$$x = A \sin(\omega t) \quad \text{(Equation 1)}$$

where A is an amplitude.

In a case where the gain is one in a system with no distortion, an analog signal output y from the DAC circuit 15 is expressed by Equation 2:

$$y = x \quad \text{(Equation 2)}$$

Then, this equation is differentiated to obtain Equation 3:

$$\frac{dy}{dx} = 1 \quad \text{(Equation 3)}$$

On the other hand, in the case of a system in which the second-order distortion is dominant, the dy/dx is expressed by Equation 4:

$$\frac{dy}{dx} = ax + 1 \quad \text{(Equation 4)}$$

Both sides of Equation 4 are integrated, and Equation 1 is substituted into the resulting equation, thereby obtaining Equation 5:

$$y = \frac{1}{2}ax^2 + x + b \quad \text{(Equation 5)}$$
$$= \frac{1}{2}aA^2 \cdot \frac{1}{2}(1 - \cos(2\omega t)) + A\sin(\omega t) + b$$
$$= \frac{1}{4}aA^2 \cos(2\omega t) + A\sin(\omega t) + b + \frac{1}{4}aA^2$$

Since the amount HD2 of the second-order distortion is expressed by (HD2)=(second-order term)/(first-order term), the following Equation 6 is obtained:

$$HD2 = \frac{1}{4}aA^2 \div A \quad \text{(Equation 6)}$$
$$\therefore a = \frac{4HD2}{A}$$

where a is a second-order correction coefficient. From Equation 6, the second-order correction coefficient a can be expressed by a function of the amplitude A of the input signal x and the amount HD2 of the second-order distortion obtained from the result of the frequency analysis.

Subsequently, it will be described how a third-order distortion correction coefficient is calculated.

In the case of a system in which the third-order distortion is dominant, dy/dx can be expressed by Equation 7:

$$\frac{dy}{dx} = cx^2 + 1 \quad \text{(Equation 7)}$$

Both sides of Equation 7 are integrated, and Equation 1 is substituted into the resulting equation, thereby obtaining Equation 8:

$$y = \frac{1}{3}cx^3 + x + d \quad \text{(Equation 8)}$$
$$= \frac{1}{3}cA^3\left[\frac{3}{4}\sin(\omega t) - \frac{1}{4}\sin(\omega t)\right] + A\sin(\omega t) + d$$
$$= -\frac{1}{12}cA^3 \sin(3\omega t) + \left[\frac{1}{4}A^2c + 1\right]A\sin(\omega t) + d$$

Since the amount HD3 of the third-order distortion is expressed by (HD3)=(third-order term)/(first-order term), the following Equation 9 is obtained:

$$HD3 = \left(-\frac{1}{12}cA^3\right) \div \left[\left(\frac{1}{4}A^2c + 1\right)A\right] \quad \text{(Equation 9)}$$
$$\therefore c = -\frac{12HD3}{A^2(1 + HD3)}$$

where c is a third-order correction coefficient. From Equation 9, the third-order correction coefficient c can be expressed by a function of the amplitude A of the input signal x and the amount HD3 of the third-order distortion obtained from the result of the frequency analysis.

Accordingly, a distortion correction function g1(x) in the case of a system in which the second-order distortion and the third-order distortion are dominant can be expressed by Equation 10:

$$g1(x) = x \pm \frac{4HD2}{A}x^2 \pm \frac{12HD3}{A^2(1 + HD3)}x^3 \quad \text{(Equation 10)}$$
$$-1 \leq x \leq 1$$

It will now be described how distortion is controlled by using the correction function g1(x).

Figure 3:
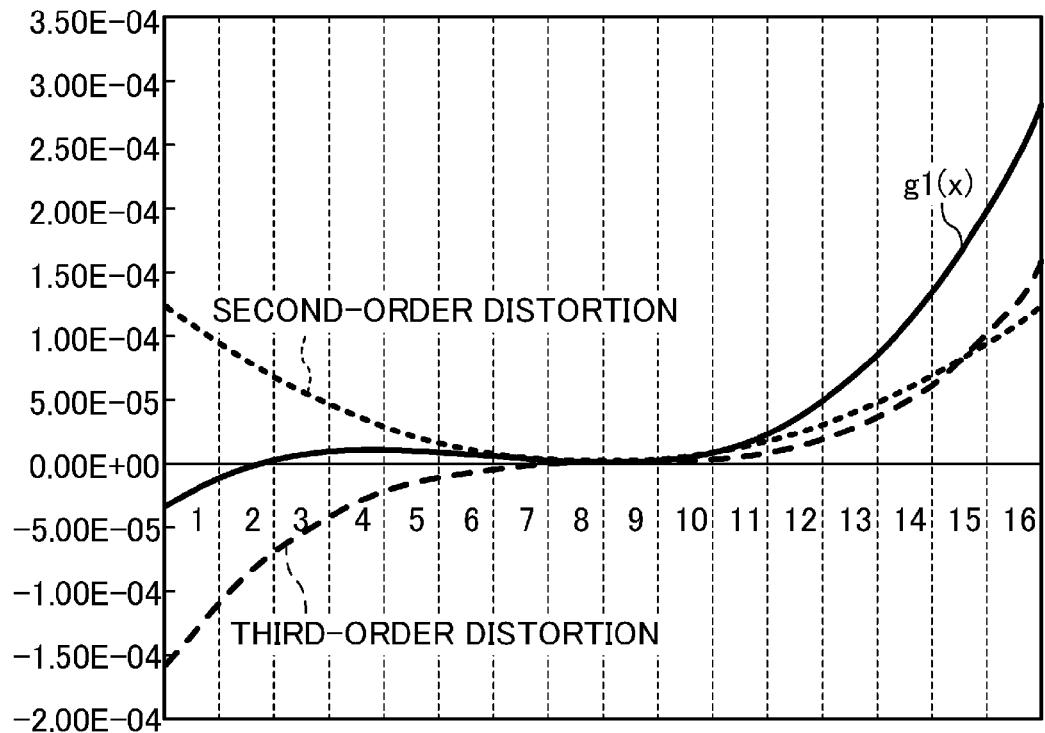
FIG. 3 is a graph showing a correction function g1(x) concerning a second-order distortion and a third-order distortion calculated based on a frequency analysis result of an analog output signal.

FIG. 3 shows the distortion correction function g1(x). In FIG. 3, the horizontal axis indicates an input operating voltage range of the DAC device of this embodiment, and the vertical axis indicates the amount of shift (distortion) from an ideal value. The dotted line indicates a second-order distortion, the broken line indicates a third-order distortion, and the solid line indicates a distortion correction function g1(x) obtained by synthesizing the second-order distortion and the third-order distortion.

In this embodiment, as an example, in the distortion correction function g1(x) shown in FIG. 3, the input operating voltage range (hereinafter referred to as an input section) of the DAC device indicated by the horizontal axis is evenly divided into 16 input sections, and the distortion amount indicated by the line of the correction function g1(x) in each of the input sections is shifted toward zero. The amount of this shift is determined as a correction value, and a correlation between each of the input sections and the corresponding correction value is stored in the look-up table of the memory 20.

In this manner, the distortion correction function g1(x) is calculated based on the intensity of a harmonics spectrum obtained by a frequency analysis on an analog sine wave signal output of the DAC device, and the obtained distortion correction function g1(x) is divided into a plurality of input sections. Thereafter, a correction value is obtained for each of the input sections. A correlation between each of the input sections and the corresponding correction value is previously stored in the look-up table of the memory 20. The nonlinear correction circuit 21 receives a signal obtained by processing a digital input signal in the digital filter 10, and based on the value of this signal, a correction value for an input section corresponding to the value is read out from the look-up table of the memory 20, and the read-out correction value is input to the subtractor 22. In this manner, the memory 20 and the nonlinear correction circuit 21 function as a correction value output section 25 that outputs a necessary correction value based on the distortion correction function g1(x). Then, the subtractor 22 subtracts the correction value from the processed digital input signal from the digital filter 10, and outputs the digital input signal subjected to the subtraction to the noise shaper 11.

Figure 4:
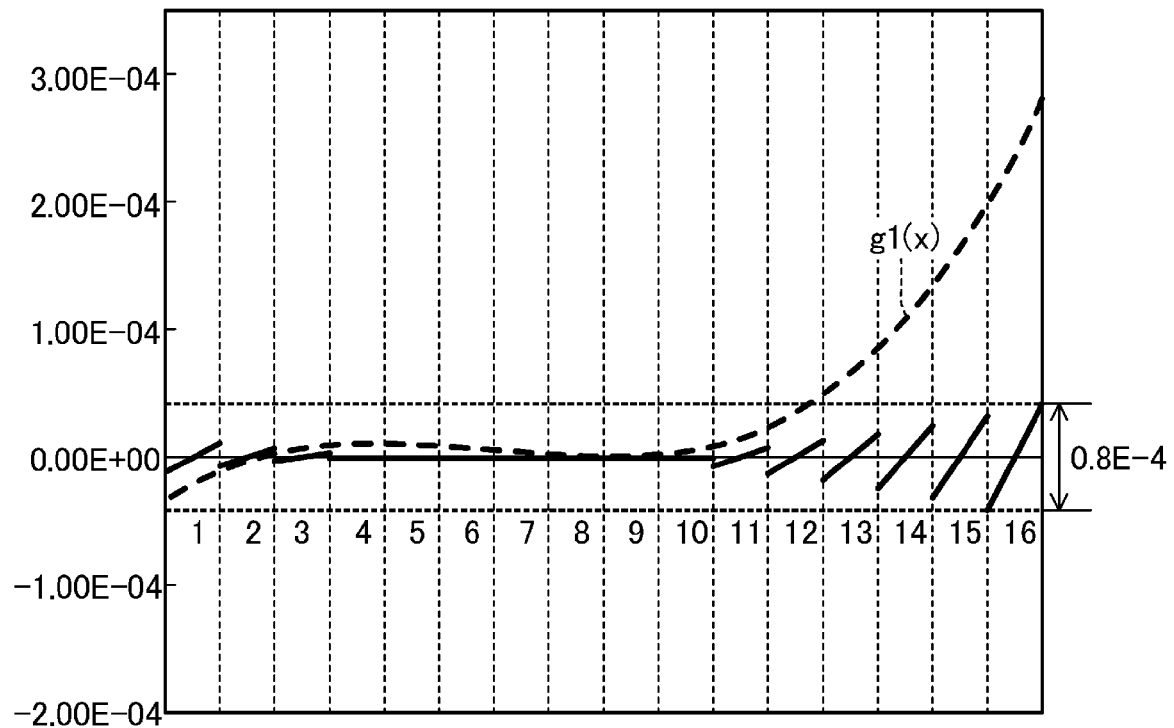
FIG. 4 is a graph showing a result of distortion correction using the distortion correction function g1(x) in the DAC device.

As described above, in this embodiment, the value corresponding to the correction value (which is the difference, i.e., shift amount, between the distortion correction function g1(x) and zero) is subtracted from the digital input signal output from the digital filter 10, for each input section. Thus, as indicated by the solid line in FIG. 4, the second-order distortion and the third-order distortion are reduced to values near zero in each input section. Thus, even when the 1-bit DAC row 13, for example, has nonlinear characteristics, harmonic components included in an analog signal output from the DAC circuit 15 can be effectively reduced.

Figure 5:
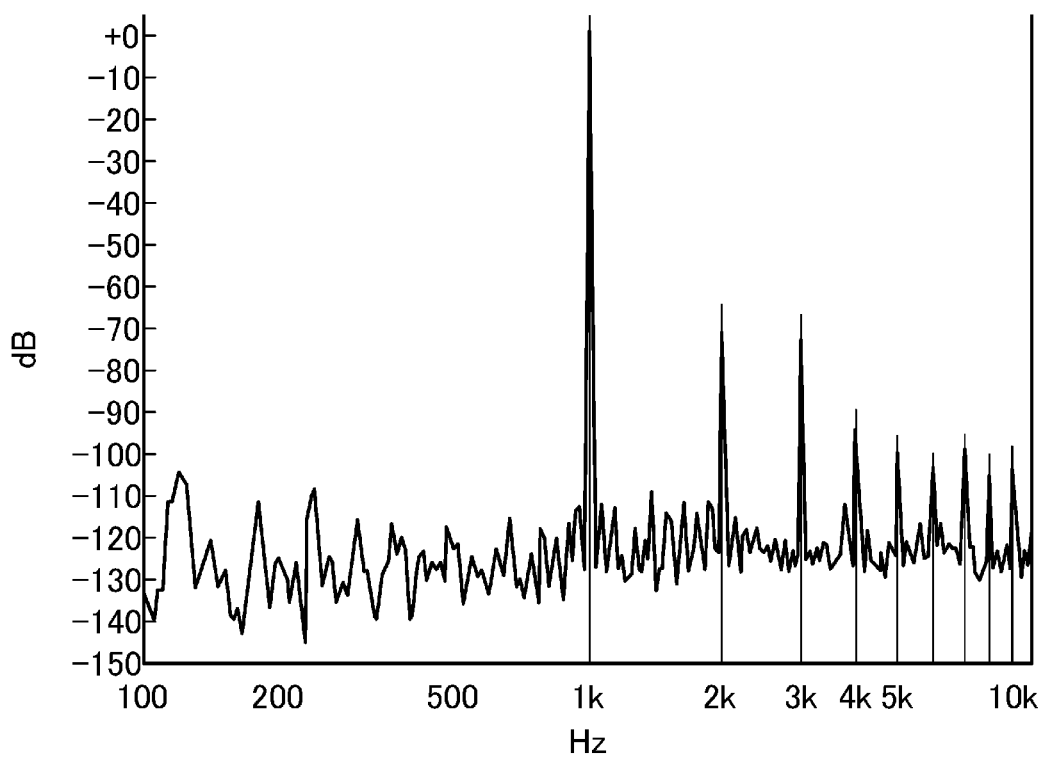
FIG. 5 is a graph showing an example of a result of a frequency analysis on an analog output signal of the DAC device after distortion correction.

FIG. 5 shows a result of a frequency analysis on an analog output signal from the DAC circuit 15 in a case where a correction value is subtracted from a digital input signal by using the memory 20, the nonlinear correction circuit 21, and the subtractor 22. As shown from a comparison between this result and the frequency analysis result before correction shown in FIG. 2, this embodiment shows an improvement of 10 dB or more for the second-order distortion and the third-order distortion.

Figure 6:
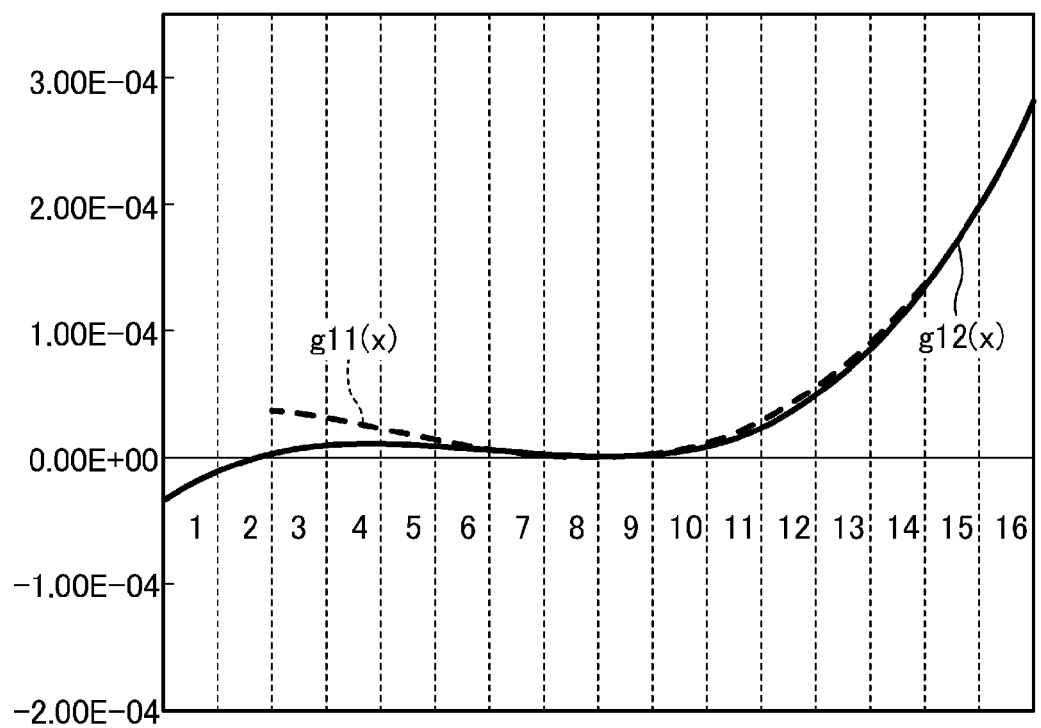
FIG. 6 is a graph showing a distortion correction function g11(x) in a case where an input voltage use range of the DAC device is limited.

The look-up table of the memory 20 previously stores a plurality of sets of correlations between the input sections and the correction values depending on the input voltage use range of the DAC device. The plurality of sets of correction values are stored in this manner in order to enhance accuracy in distortion correction by switching the correction function g1(x) depending on the input voltage use range of the DAC device. For example, as illustrated in FIG. 6, in a case where the input voltage use range of the DAC device is limited to the third through fourteenth input sections in accordance with the input digital signal, a distortion correction function g11(x) indicated by the broken line in FIG. 6 and calculated based on the results of frequency analyses for these limited input sections differs, in distortion amount especially in the third through sixth input sections, from a distortion correction function g12(x) indicated by the solid line in FIG. 6 and calculated based on results of frequency analyses for all the first through sixteenth input sections. Thus, distortion correction based on the correction function g12(x) would have a large degree of errors. In view of this, switching of the distortion correction function in accordance with the input voltage use range can enhance distortion correction accuracy.

In the foregoing embodiment, the correction coefficients a and c for the second-order distortion and the third-order distortion are calculated. With the technique disclosed herein, correction coefficients for higher-order distortions can also be calculated in a similar manner.

Figure 7:
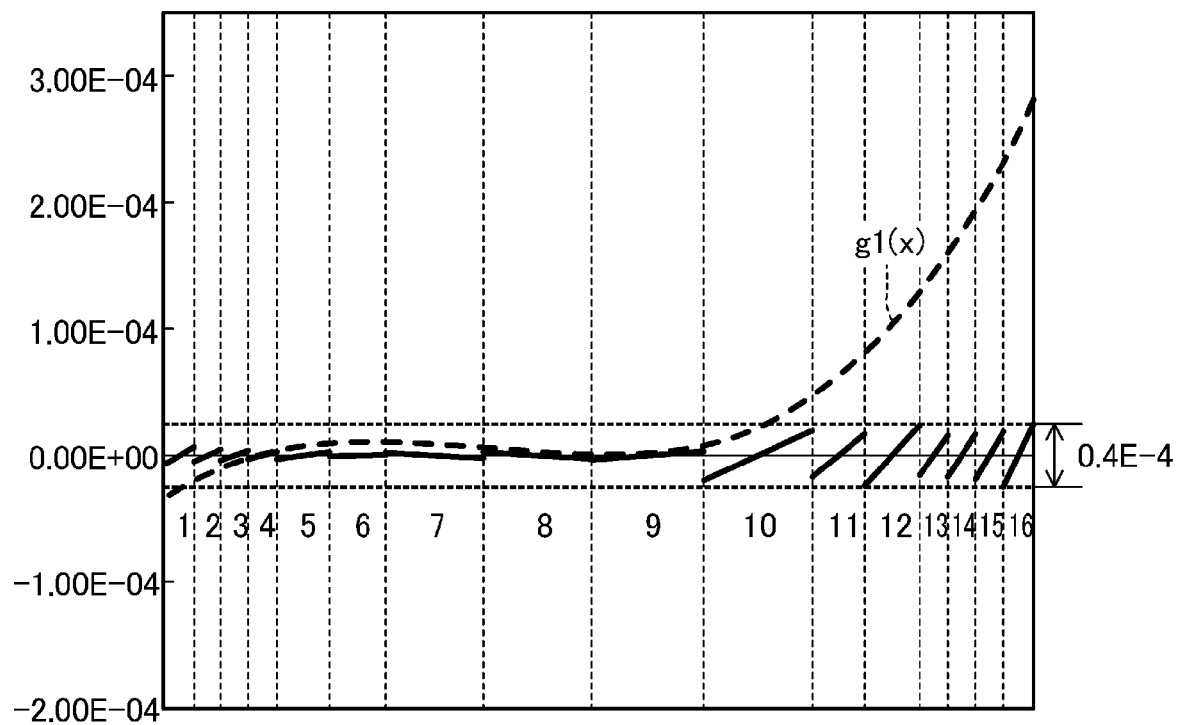
FIG. 7 is a graph showing an example in which the entire input section of the distortion correction function g1(x) indicated by the horizontal axis is divided into a plurality of input sections such that the width of the input sections decreases as the distortion amount increases.
Figure 8:
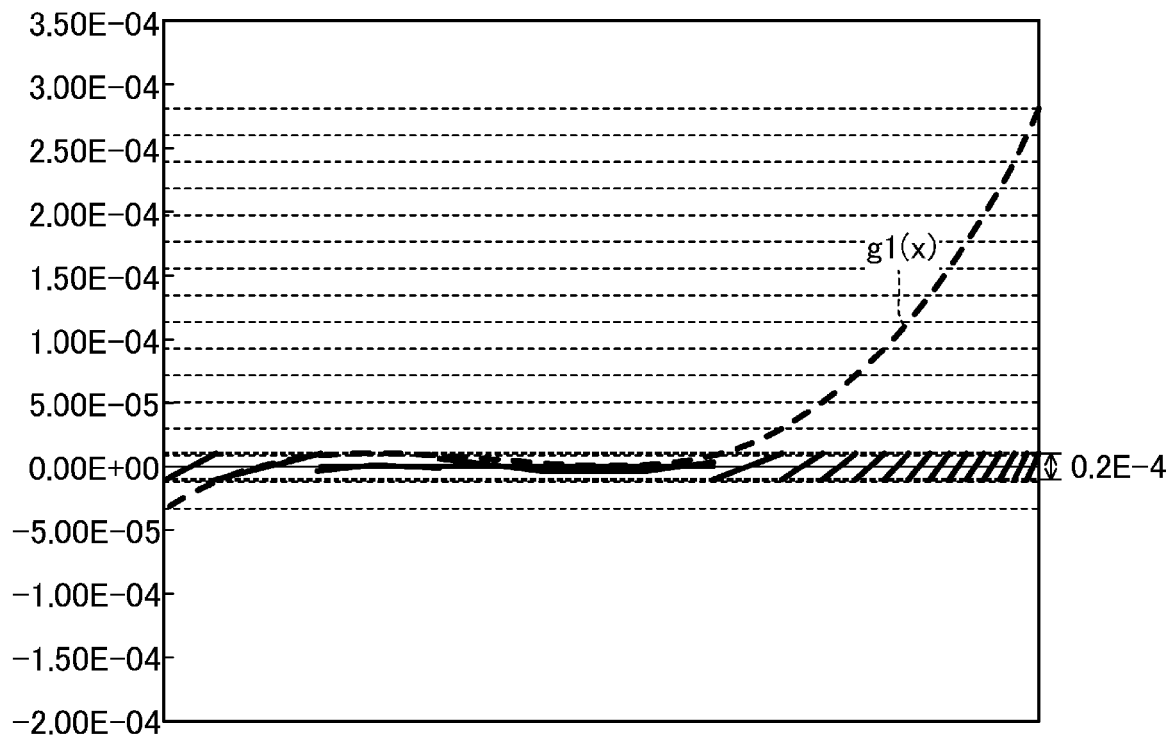
FIG. 8 shows an example in which the amount of change in distortion of the distortion correction function g1(x) is uniform among input sections.

Although the input sections are evenly divided as shown in FIG. 3, the present disclosure is not limited to this example. For example, as shown in FIG. 7, the distortion correction accuracy can be enhanced by finely dividing input sections where the gradient of the distortion correction function g1(x) is large, i.e., the change in distortion amount is large. Specifically, in FIG. 7, input sections where the gradient of the distortion correction function g1(x) is large are the first through fourth and eleventh through sixteenth input sections that are located near the ends of the input operating voltage range and show larger changes in distortion amount than the fifth through tenth input sections that are located around the middle of the input operating voltage range. As shown in FIG. 8, the input sections may be partitioned at every predetermined range of change in distortion amount of the distortion correction function g1(x). In this case, the range of change in distortion amount can be uniform among the input sections, thereby enabling further enhancement of the distortion correction accuracy.

Figure 9:
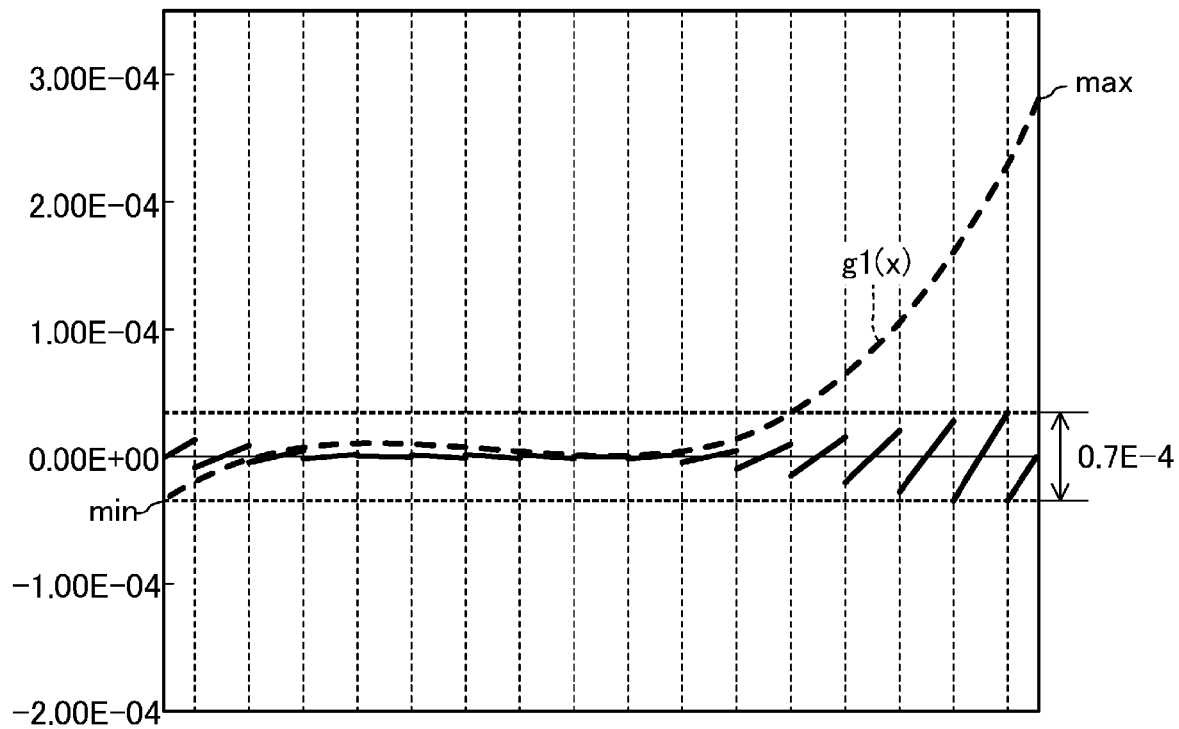
FIG. 9 is a graph showing an example in which the distortion amount included in an analog output signal is zero at a maximum distortion point and a minimum distortion point of the distortion correction function g1(x).

As illustrated in FIG. 9, the correction value (i.e., the shift amount) to be stored in the look-up table of the memory 20 may be determined such that the distortion amount are zero at a minimum distortion point min and a maximum distortion point max. In this case, distortion characteristics at an input of a large amplitude and an input of a small amplitude can be improved.

Second Embodiment

A second embodiment of the present disclosure will be described.

Figure 10:
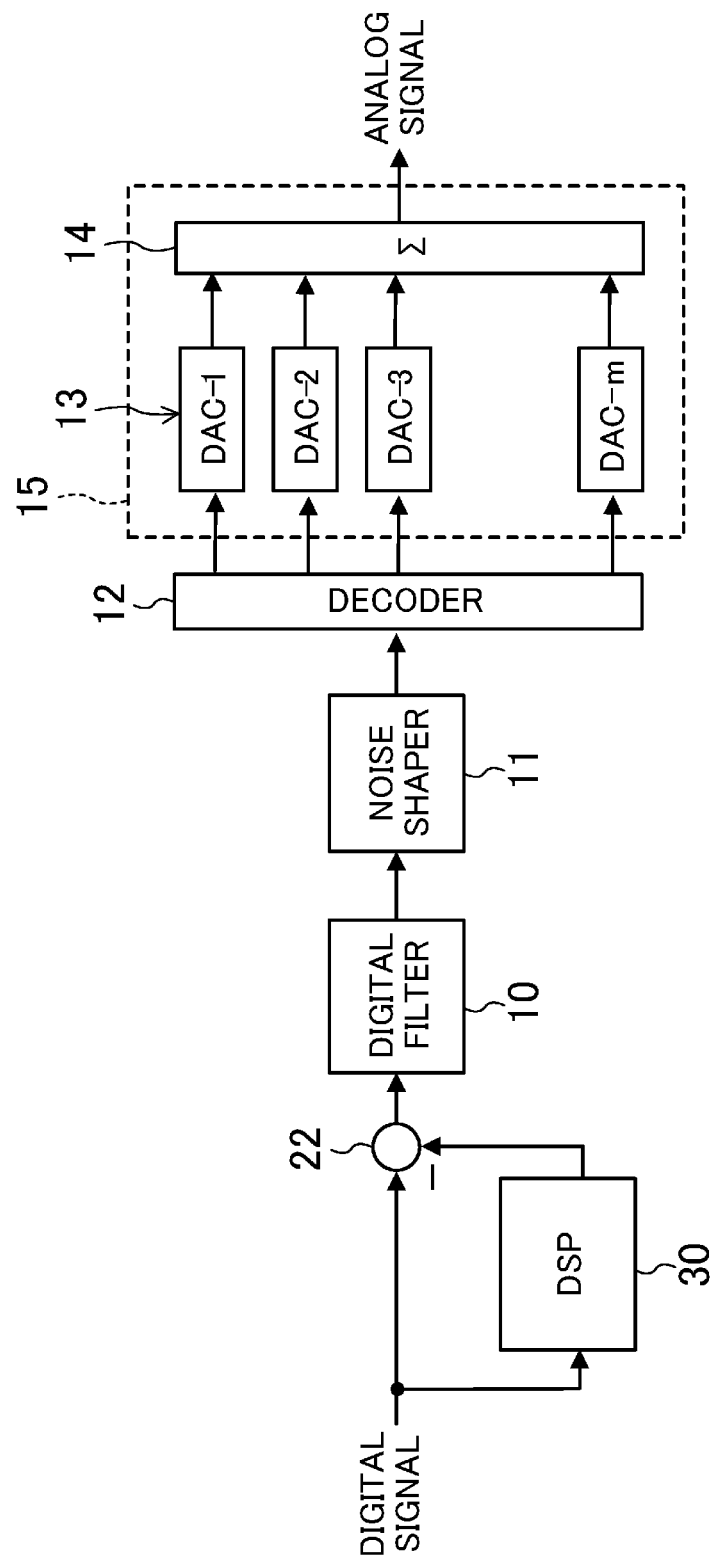
FIG. 10 is a block diagram illustrating an overall configuration of a DAC device according to a second embodiment of the present disclosure.

FIG. 10 is a block diagram illustrating a DAC device according to the second embodiment. In this embodiment, the memory 20, the nonlinear correction circuit 21, and the subtractor 22 illustrated in FIG. 1 are replaced by a digital signal processor (DSP) (a computing section) 30 and a subtractor 22 located at previous stages of a digital filter 10.

In this embodiment, the DSP (a correction value output section) 30 receives a digital input signal, obtains a correction value corresponding to the digital input signal based on a distortion correction function g1(x) derived from distortion information on a result of a frequency analysis on an analog output signal as described above, and outputs the obtained correction value to the subtractor 22. The other part of the configuration is similar to that illustrated in FIG. 1.

Figure 11:
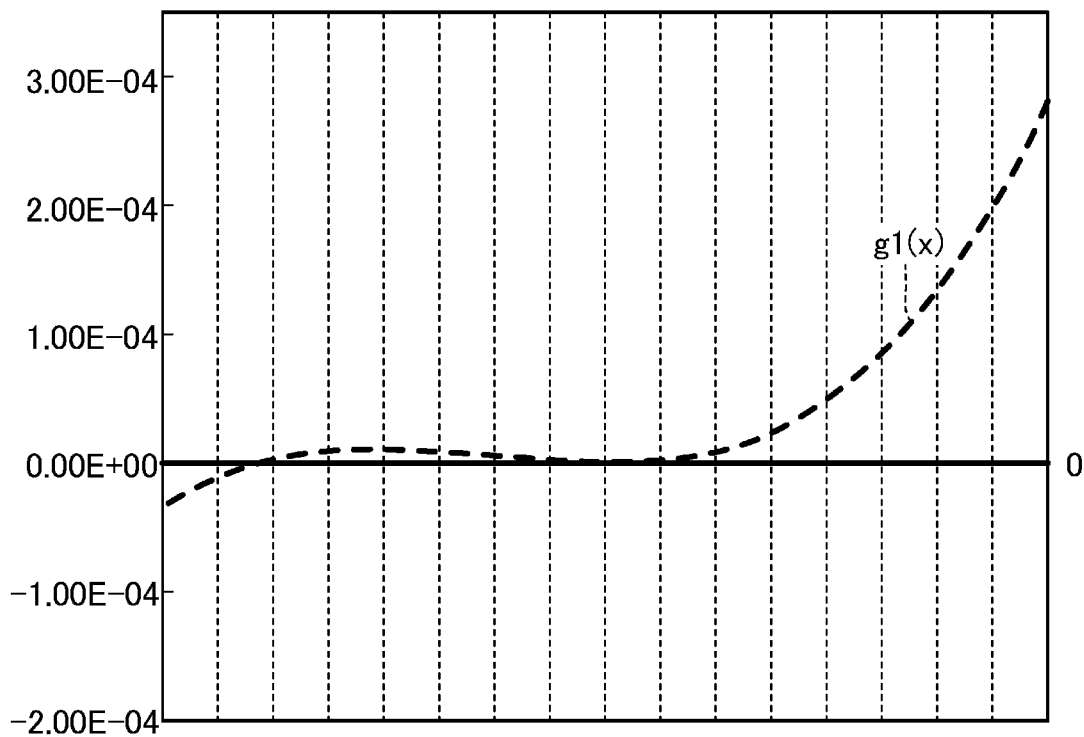
FIG. 11 is a graph showing a result of distortion correction using a distortion correction function g1(x) in the DAC device of the second embodiment.

Thus, in the second embodiment, unlike the first embodiment in which the distortion correction function g1(x) is divided into a plurality of input sections, a correction value based on the distortion correction function g1(x) is obtained directly from the value of a digital input signal. Thus, as illustrated in FIG. 11, the distortion amount can be always corrected to zero in the entire input voltage range.

Third Embodiment

Figure 12:
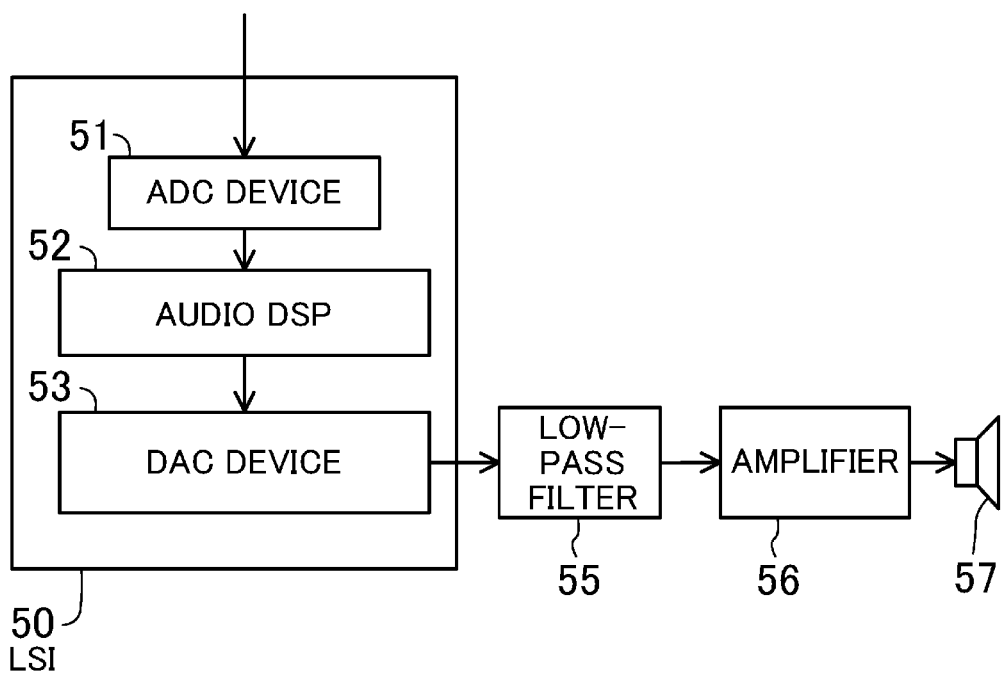
FIG. 12 is a block diagram schematically illustrating an overall configuration of an audio system according to a third embodiment of the present disclosure.

FIG. 12 schematically illustrates an overall configuration of an audio system using the above-described DAC device.

The audio system illustrated in FIG. 12 includes an LSI 50 that receives a signal from a medium such as a CD and a DVD. The LSI 50 includes an analog-to-digital conversion (ADC) device 51 that performs analog-to-digital (AD) conversion on a signal from the medium, an AUDIO DSP 52 that performs predetermined processing on a digital signal from the ADC device 51, and a DAC device 53 that performs (digital-to-analog) DA conversion on the digital signal processed by the DSP 52. The DAC device 53 corresponds to the DAC device of the first or second embodiment. An analog signal from the DAC device 53 of the LSI 50 is output to a loudspeaker 57 via a low-pass filter (signal processing circuit) 55 and an amplifier (signal processing circuit) 56.

An analog output signal from the amplifier 56 at the last output stage of the audio system is subjected to a frequency analysis, and based on the analysis result, correction coefficients a and c of the distortion correction function g1(x) are calculated.

Thus, in this embodiment, in consideration of all the nonlinear characteristics from the DAC device 53 to the last output stage of the audio system, high-order harmonic components due to these nonlinear characteristics can be reduced, thereby effectively reducing distortions.

The audio system illustrated in FIG. 12 may be part of a video system that performs video display and audio output by processing video signals and audio signals.

Fourth Embodiment

A fourth embodiment of the present disclosure will be described.

In the first embodiment, the distortion correction function g1(x) is derived based on the result of the frequency analysis on the analog output signal from the DAC device. On the other hand, this embodiment is directed to the fact that harmonic components appear due to analog elements (e.g., parasitic resistances of a predetermined power supply and a GND power supply connected to the DACs and switching characteristics of internal switches) of the 1-bit DACs DAC-1 to DAC-m in the 1-bit DAC row 13. Based on the analog elements, the distortion correction function is derived. The overall configuration of the fourth embodiment is similar to that illustrated in FIG. 1.

Figure 13:
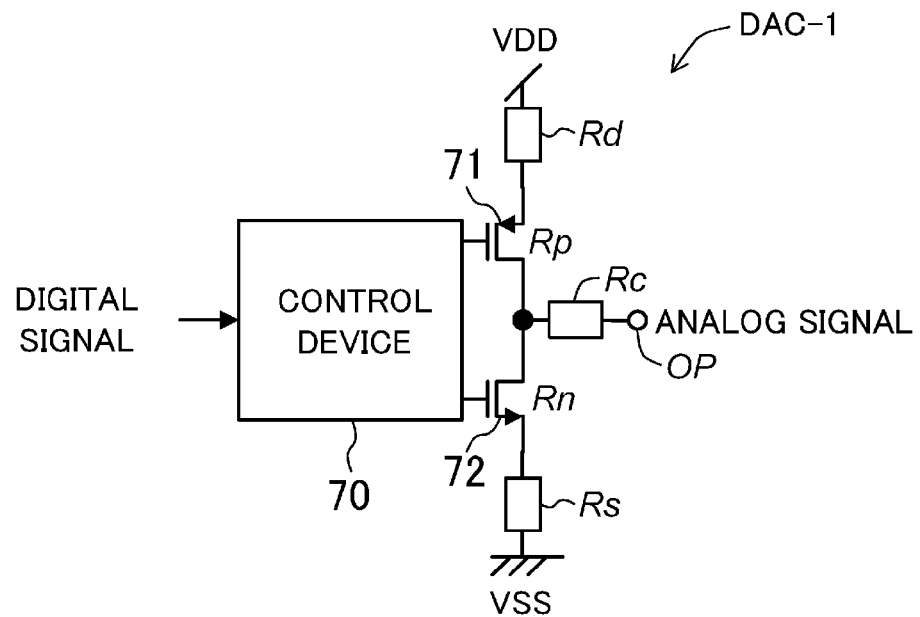
FIG. 13 is a block diagram schematically illustrating a main portion of a DAC device according to a fourth embodiment of the present disclosure.

The overall configuration of this embodiment will be specifically described with reference to FIG. 13. FIG. 13 illustrates an internal configuration of a main portion of a 1-bit DAC (e.g., the DAC-1 in this example) in the 1-bit DAC 13 illustrated in FIG. 1. In the 1-bit DAC DAC-1, VDD denotes a power supply of a predetermined voltage, VSS denotes a GND power supply, OP denotes an output terminal of an analog signal, 71 denotes an internal switch constituted by a PMOS transistor located between the predetermined power supply VDD and the output terminal OP, 72 denotes an internal switch constituted by an NMOS transistor located between the GND power supply VSS and the output terminal OP, and 70 denotes a control device that controls on and off states of the two internal switches 71 and 72. In addition, Rd denotes a resistance of wiring connecting the predetermined power supply VDD to a power supply line and the internal switch 71, Rs denotes a resistance of wiring connecting the GND power supply VSS to a power supply line and the internal switch 72, Rp denotes a resistance of the internal switch 71, Rn denotes a resistance of the internal switch 72, and Rc denotes an output resistance of a line connecting the output terminal OP to a connection node between the two internal switches 71 and 72.

It will now be described how a distortion correction function g2(x) is derived by using five parameters Rd, Rs, Rp, Rn, and Rc of the resistances.

Suppose an output signal in a case where a signal x is input to the 1-bit DAC DAC-1 is y1, the output signal y1 is expressed by Equation 11:

$$y_1 = \frac{\left(\frac{Rn+Rp}{x}\right)+Rs}{Rd+\left(\frac{Rp+Rc}{1-x}\right)+\left(\frac{Rn+Rc}{x}\right)+Rs} \quad \text{(Equation 11)}$$

$$0 \leq x \leq 1$$

Here, suppose an ideal output signal with no distortion is y2, the output signal y2 is expressed by Equation 12:

$$y_2 = -x+1 \quad \text{(Equation 12)}$$

Then, a distortion component can be obtained from the difference between Equation 11 and Equation 12. The obtained distortion component is used as a distortion correction function g2(x), and the distortion correction function g2(x) (=y1−y2) is expressed by Equation 13:

$$g2(x) = \frac{\left(\frac{Rn+Rp}{x}\right)+Rs}{Rd+\left(\frac{Rp+Rc}{1-x}\right)+\left(\frac{Rn+Rc}{x}\right)+Rs} - (-x+1) \quad \text{(Equation 13)}$$

$$0 \leq x \leq 1$$

Figure 14:
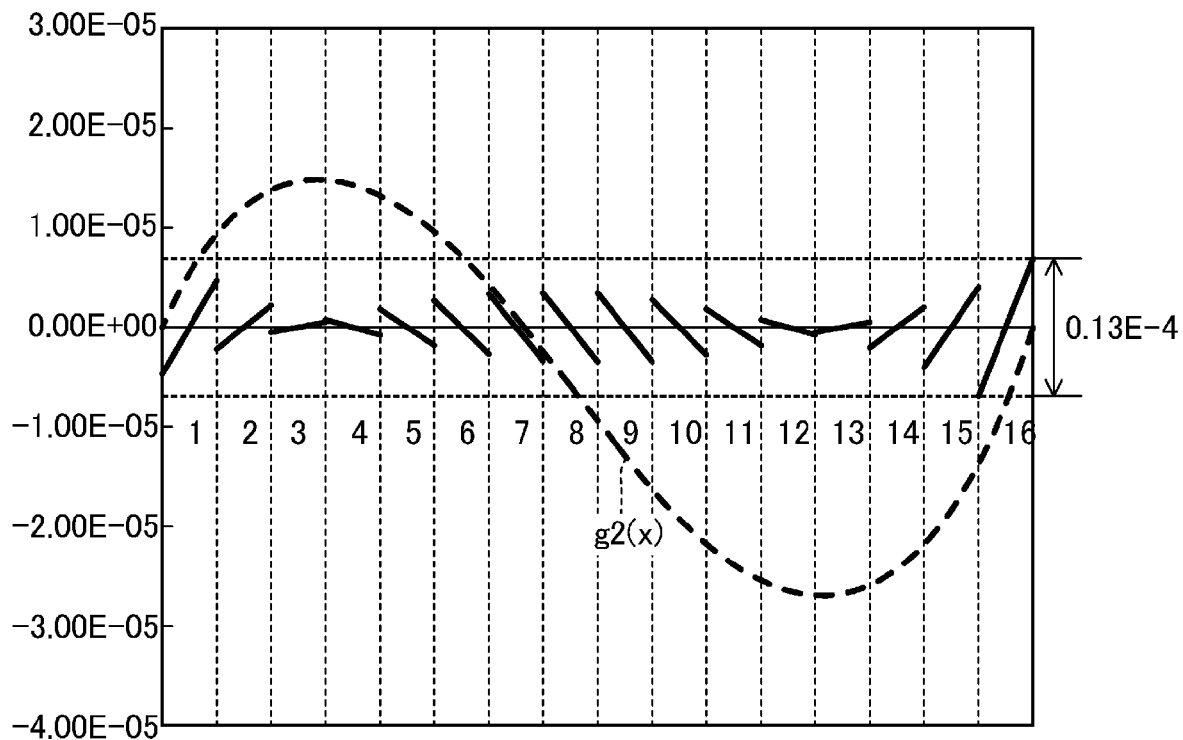
FIG. 14 is a graph showing a result of distortion correction using a distortion correction function g2(x) in the DAC device of the fourth embodiment.

The obtained distortion correction function g2(x) is indicated by the broken line in FIG. 14. In a manner similar to the first embodiment, the operating voltage range indicated by the horizontal axis in FIG. 14 is divided into 16 input sections. Then, as indicated by the solid lines in FIG. 14, the distortion is reduced to a value close to zero in each of the input sections. Thus, even when the 1-bit converters DAC-1 to DAC-m of the 1-bit DAC row 13 have nonlinear characteristics, second-order, third-order, fourth-order, . . . harmonic components included in an analog signal output from the DAC circuit 15 can be effectively reduced.

As described above, the DAC device of the present disclosure can effectively reduce the influence of harmonic components occurring due to analog elements of DAC circuits that increases distortions and thus can achieve low distortions. Thus, the present disclosure is useful in application to DAC devices and audio or video devices including the DAC devices.

What is claimed is:
1. A digital-to-analog conversion (DAC) device comprising:
a subtraction section configured to subtract a correction value from an input digital signal;
a DAC circuit configured to receive the digital signal from which the correction value has been subtracted by the subtraction section, and to convert the digital signal to an analog signal; and
a correction value output section configured to output the correction value to the subtraction section, wherein:
the correction value is determined by using a distortion correction function,
the distortion correction function is predetermined based on a distortion component included in a distorted analog signal,
the distorted analog signal is a signal that is distorted by an analog element in the DAC and output from the DAC circuit, when a predetermined input digital signal is input to the DAC circuit without passing through the subtraction section.

2. The DAC device of claim 1, wherein
the analog element in the DAC circuit is at least one selected from the group consisting of a resistance of wiring connecting the DAC circuit to a predetermined power supply, a resistance of wiring connecting the DAC circuit to a GND power supply, a resistance of an internal switch, and an output resistance.

3. The DAC device of claim 1, wherein
the correction value output section includes:
- a memory configured to store a correlation between each of input sections obtained by dividing an entire input section corresponding to an input voltage range of the input digital signal of the DAC device in the distortion correction function, and a correction value based on the distortion correction function that is predetermined for the corresponding one of the input sections; and
- a nonlinear correction circuit configured to receive the input digital signal, read a correction value corresponding to the received digital signal from the memory section, and output the correction value to the subtraction section.

4. The DAC device of claim 3, wherein
the memory stores a plurality of distortion correction functions in accordance with a voltage range of a digital signal to be input.

5. The DAC device of claim 3, wherein
the memory includes a look-up table that stores a correlation between each of the input sections and a corresponding correction value.

6. The DAC device of claim 3, wherein
the entire input section of the distortion correction function in the memory is evenly divided into the plurality of input sections.

7. The DAC device of claim 3, wherein
the entire input section of the distortion correction function in the memory is divided into the plurality of input sections such that a width of the input sections decreases as a degree of change in the distortion correction function increases.

8. The DAC device of claim 6, wherein
the correction value is determined such that a distortion component included in an analog signal output from the DAC circuit is close to zero at a maximum distortion point and a minimum distortion point of the distortion correction function in the memory.

9. The DAC device of claim 6, wherein
the correction value is determined such that a distortion component included in the analog signal output from the DAC circuit is close to zero at a maximum distortion point and a minimum distortion point of the distortion correction function in the memory.

10. The DAC device of claim 3, wherein
the entire input section of the distortion correction function in the memory section is divided into the plurality of input sections such that an amount of change in distortion of the distortion correction function is uniform among the plurality of input.

11. The DAC device of claim 10, wherein
the correction value is determined such that a distortion component included in the analog signal output from the DAC circuit is close to zero at a maximum distortion point and a minimum distortion point of the distortion correction function in the memory.

12. The DAC device of claim 10, wherein
the correction value is determined such that a distortion component included in the analog signal output from the DAC circuit is zero at a maximum distortion point and a minimum distortion point of the distortion correction function in the memory.

13. The DAC device of claim 1, wherein
the correction value output section is a computing section that receives the input digital signal, and based on the received digital signal and the distortion correction function, obtains a correction value to be output to the subtraction section.

14. The DAC device of claim 13, wherein
the computing section switches the distortion correction function to be used by the computing section, in accordance with a voltage range of a digital signal to be input.

15. An audio system comprising:
the DAC device of claim 1;
a loudspeaker; and
a signal processing circuit, wherein
an audio signal converted to an analog signal by the DAC device is output from the loudspeaker through the signal processing circuit.

16. The DAC device of claim 1, further comprising:
- a digital filter configured to multiply a sampling frequency of the input digital signal by n (where n≥2);
- a noise shaper configured to receive an output from the digital filter and change frequency characteristics of noise to predetermined characteristics together with word length limitation;
- a decoder configured to receive an output from the noise shaper as an input and convert the received output to a 1-bit signal series in accordance with a value of the input;
- a 1-bit DAC row configured to convert an output from the decoder to an analog signal; and
- an analog adder configured to obtain a sum of outputs from the 1-bit DAC row, wherein
the output from the decoder is determined such that the number of 1-bit signals is cyclic in accordance with a value of the output from the noise shaper.

* * * * *